United States Patent
Yeung et al.

(10) Patent No.: US 8,014,226 B2
(45) Date of Patent: Sep. 6, 2011

(54) INTEGRATED CIRCUIT MEMORY WITH WORD LINE DRIVING HELPER CIRCUITS

(75) Inventors: Gus Yeung, Austin, TX (US); Amarnath Shanmugam, Austin, TX (US); Yew Keong Chong, New Braunfels, TX (US); Jacek Wiatrowski, Austin, TX (US)

(73) Assignee: ARM Limited, Cambridge (GB)

( * ) Notice: Subject to any disclaimer, the term of this patent is extended or adjusted under 35 U.S.C. 154(b) by 9 days.

(21) Appl. No.: 12/654,520

(22) Filed: Dec. 22, 2009

(65) Prior Publication Data

US 2011/0149674 A1    Jun. 23, 2011

(51) Int. Cl.
*G11C 11/24* (2006.01)

(52) U.S. Cl. ............. 365/230.06; 327/589; 327/536

(58) Field of Classification Search .......... None
See application file for complete search history.

(56) References Cited

U.S. PATENT DOCUMENTS

| 5,774,392 | A * | 6/1998 | Kraus et al. ............ 365/145 |
| 6,545,933 | B2 * | 4/2003 | Sekiguchi et al. ...... 365/230.03 |
| 7,221,616 | B2 * | 5/2007 | Jeon .................... 365/230.06 |
| 2005/0231998 | A1 * | 10/2005 | Kang ................... 365/145 |
| 2008/0291750 | A1 * | 11/2008 | Takahashi et al. ...... 365/189.09 |
| 2008/0310229 | A1 * | 12/2008 | Hamada ................ 365/185.11 |

* cited by examiner

*Primary Examiner* — Hoai V Ho
*Assistant Examiner* — James G Norman
(74) *Attorney, Agent, or Firm* — Nixon & Vanderhye P.C.

(57) ABSTRACT

An integrated circuit memory 2 incorporates a first array of bit cells 4 and a second array of bit cells 6 with word line driver circuitry 8 disposed therebetween. Word line helper circuitry 18, 20 is disposed at the opposite edges of the array 4, 6 to the word line driver circuitry 8. The helper circuitry is responsive to the word line signal on a word line 12 being driven towards an asserted value to switch on and further drive the word line signal towards the asserted value. The helper circuitry is switched off by a global reset signal, which may be a self-timed global reset signal.

18 Claims, 5 Drawing Sheets

INTEGRATED CIRCUIT MEMORY WITH WORD LINE DRIVING HELPER CIRCUITS

BACKGROUND OF THE INVENTION

1. Field of the Invention

This invention relates to the field of integrated circuit memories. More particularly, this invention relates to the driving of word line signals within integrated circuit memories.

2. Description of the Prior Art

It is known to provide integrated circuit memories comprising arrays of bit cells. Word lines carrying word line signals run through these arrays and are used to select a row of bit cells to be accessed. An address of a memory location is input to an integrated circuit memory which decodes this address and determines which word line through an array of bit cells should be driven to an asserted value so that the corresponding row of bit cells may be accessed. As process geometries have become smaller and memory densities higher, problems have arisen in propagation of the word line signal through the array. The word line itself has a finite resistance and capacitance such that it acts as a distributed RC element which slows the word line signal rising to the asserted value when driven by the word line driver circuitry. The problems of the word line signal being too slow to reach its asserted values are made worse when operating at lower operating voltages. Such lower operating voltages are desirable for other reasons, such as power saving. Furthermore, the smaller process geometries tend to suffer from more chip-to-chip variation and even significant amounts of variation due to process, voltage and temperature within an individual chip. The effect of the bit lines running through the array coupling with the word lines also tends to reduce the speed with which the word line signal reaches the asserted value. This coupling with the bit lines also becomes worse as process geometries become smaller. These factors tend to combine to slow the speed with which the word line signal reaches the asserted value and accordingly slow the operation of the memory since an increased amount of time has to be allowed between accesses in order to allow sufficient time to be sure that the word line signal has properly reached its asserted value so that the access required will have been properly performed.

One known way of addressing this problem is to provide word line driver circuitry at each end of a word line passing through an array such that the word line may be driven from each of its ends and so reduce the effect of the distributed resistance and distributed capacitance of the word line. The technique of providing word line drivers at each end of the word line does address the above problems, but suffers from the disadvantage that a second set of word line driver circuitry and associated decoders and control circuitry need to be provided and this consumes an undesirable amount of circuit overhead. In turn, this adversely affects the circuit density of the memory as a whole and tends to increase its cost and power consumption.

SUMMARY OF THE INVENTION

Viewed from one aspect the present invention provides an integrated circuit memory comprising:

a first array of memory cells;

a second array of memory cells;

word line driver circuitry located between said first array and said second array;

a first plurality of word lines extending from a first side of said word line driver circuitry through said first array;

a second plurality of word lines extending from a second side of said word line driver circuitry through said second array;

a first plurality of word line helper circuits coupled to respective word lines of said first plurality of word lines; and a second plurality of word line helper circuits coupled to respective word lines of said second plurality of word lines; wherein said word line driver circuitry is responsive to an access request to drive a first word line signal upon a first driven word line of said first plurality of word lines toward a first asserted value and to drive a second word line signal upon a second driven word line of said second plurality of word lines toward a second asserted value;

said first plurality of word line helper circuits include a first word line helper circuit coupled to said first driven word line and switched by said first word line signal being driven toward said first asserted value to further drive said first word line signal toward said first asserted value such that said first word line signal value more rapidly reaches said first asserted value; and said second plurality of word line helper circuits include a second word line helper circuit coupled to said second driven word line and switched by said second word line signal being driven toward said second asserted value to further drive said second word line signal toward said second asserted value such that said second word line signal value more rapidly reaches said second asserted value.

The present technique recognises that if word line driver circuitry is placed between two arrays of memory cells such that a word line crossing both arrays is effectively driven from its mid point, then the effective length of the word line is reduced. If this feature is combined with first and second word line helper circuitry triggered by a change of the word line signal toward the asserted value itself, then these helper circuits can further drive the respective portions of the word line in a manner which increases the speed with which the word line signal reaches the asserted value. As the word line helper circuits are triggered by the rise in the word line signal, they do not themselves need to be triggered by a decoding of the address and accordingly can be provided with relatively little circuit overhead. The effect of the word line helper circuits in speeding the change in the word line signal once this has reached a level to trigger their action, is sufficient to more than justify their inclusion within the memory given the relatively small amount of circuit overhead they impose. It is possible to use more than one helper circuit within each array.

In order that any action of the word line helper circuits in driving the word line is limited to times when this is appropriate, some embodiments of the invention provide that the word line helper circuits are responsive to a reset signal to cease driving the word lines toward the asserted value. In this way, word line helper circuits can be switched on by the rise in the word line voltage toward the asserted value and then switched off by a reset signal such that they do not fight/oppose subsequent desired changes in the word line signal level.

The reset signal could take a variety of different forms. For example, it could be a reset signal dedicated to switching off the word line helper circuits. However, in some embodiments the reset signal is a global reset signal which also serves to trigger the word line driver circuitry to drive the word line signal away from the asserted value, e.g. the same signal, or a commonly derived signal, which switches off the word line driver circuit may also be used to switch off the word line helper circuits.

One generally available form of reset signal is a global reset signal that is self-timed a predetermined time after initiation of the access request. Such a self-timed global reset signal is often already available within an integrated circuit to control the timing and phasing of different actions within the integrated circuit memory.

The global reset signal may, for example, be triggered from a trailing edge of a word line pulse signal controlling the word line driver circuitry. It is also possible to use a delayed version of the rising edge of the word line pulse signal.

The helper circuitry can take a wide variety of different forms. One particular form of the helper circuitry includes a helper transistor configured to selectively couple the drive word line to a supply rail carrying a supply signal corresponding to the first asserted value. Thus, by switching on and off this helper transistor the word line concerned can be further driven towards the asserted value.

In the context of helper circuits including such a helper transistor, the helper transistor may have a first helper gate node which is at least partially controlled by the word line signal. Thus, the word line signal starting to rise toward the asserted value can switch on the helper transistor such that it then assists in driving the word line signal further towards the asserted value.

While the helper gate node could be directly coupled to the word line signal, in some embodiments it is coupled to a combinatorial logic circuit combining the first word line signal with a reset signal. In this way, the action of both the first word line signal and the reset signal in controlling the helper circuit may be provided while the number of transistors between the supply signal and the word line can be kept low allowing for more effective driving of the word line by the helper circuit.

In other embodiments, the helper transistor may be coupled to the supply rail via a header transistor with the header transistor being responsive to a reset signal to block a signal path from the supply rail to the drive word line.

While it will be appreciated that the helper circuits could be disposed at a variety of different positions relative to the array, such as within the array, it is convenient to provide the helper circuits at the edge of the array opposite to the edge of the array where the word line driver circuitry is located. Thus, a word line passing through an array is driven from one end by the word line driver circuitry and driven from the other end by the word line helper circuitry. The array itself does not need to accommodate the word line helper circuits and accordingly it is easier to provide a higher density array.

While it will be appreciated that the first word line signal and the second word line signal may be separate signals generated by the word line driver circuitry, in many embodiments it is practical for these to be generated as a common word line signal which propagates from the word line driver circuitry located between the first array and the second array out through the word lines of the two arrays toward the respective helper circuitry located at the other edges of the arrays.

Viewed from another aspect the present invention provides an integrated circuit memory comprising:

a first array of memory cell means;
a second array of memory cell means;
word line driver means located between said first array and said second array;
a first plurality of word lines extending from a first side of said word line driver means through said first array;
a second plurality of word lines extending from a second side of said word line driver means through said second array;
a first plurality of word line helper means coupled to respective word lines of said first plurality of word lines; and
a second plurality of word line helper means coupled to respective word lines of said second plurality of word lines; wherein
said word line driver means is responsive to an access request to drive a first word line signal upon a first driven word line of said first plurality of word lines toward a first asserted value and to drive a second word line signal upon a second driven word line of said second plurality of word lines toward a second asserted value;
said first plurality of word line helper means include a first word line helper means coupled to said first driven word line and switched by said first word line signal being driven toward said first asserted value to further drive said first word line signal toward said first asserted value such that said first word line signal value more rapidly reaches said first asserted value; and
said second plurality of word line helper means include a second word line helper means coupled to said second driven word line and switched by said second word line signal being driven toward said second asserted value to further drive said second word line signal toward said second asserted value such that said second word line signal value more rapidly reaches said second asserted value.

Viewed from a further aspect the present invention provides a method of operating an integrated circuit memory having:

a first array of memory cells;
a second array of memory cells;
word line driver circuitry located between said first array and said second array;
a first plurality of word lines extending from a first side of said word line driver means through said first array;
a second plurality of word lines extending from a second side of said word line driver means through said second array;
a first plurality of word line helper circuits coupled to respective word lines of said first plurality of word lines; and
a second plurality of word line helper circuits coupled to respective word lines of said second plurality of word lines;
said method comprising the steps of:
in response to an access request, driving a first word line signal upon a first driven word line of said first plurality of word lines toward a first asserted value and driving a second word line signal upon a second driven word line of said second plurality of word lines toward a second asserted value;
using a first word line helper circuit of said first plurality of word line helper circuits and switched by said first word line signal being driven toward said first asserted value to further drive said first word line signal toward said first asserted value such that said first word line signal value more rapidly reaches said first asserted value; and
using a second word line helper circuit of said second plurality of word line helper circuits and switched by said second word line signal being driven toward said second asserted value to further drive said second word line signal toward said second asserted value such that second first word line signal value more rapidly reaches said second asserted value.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
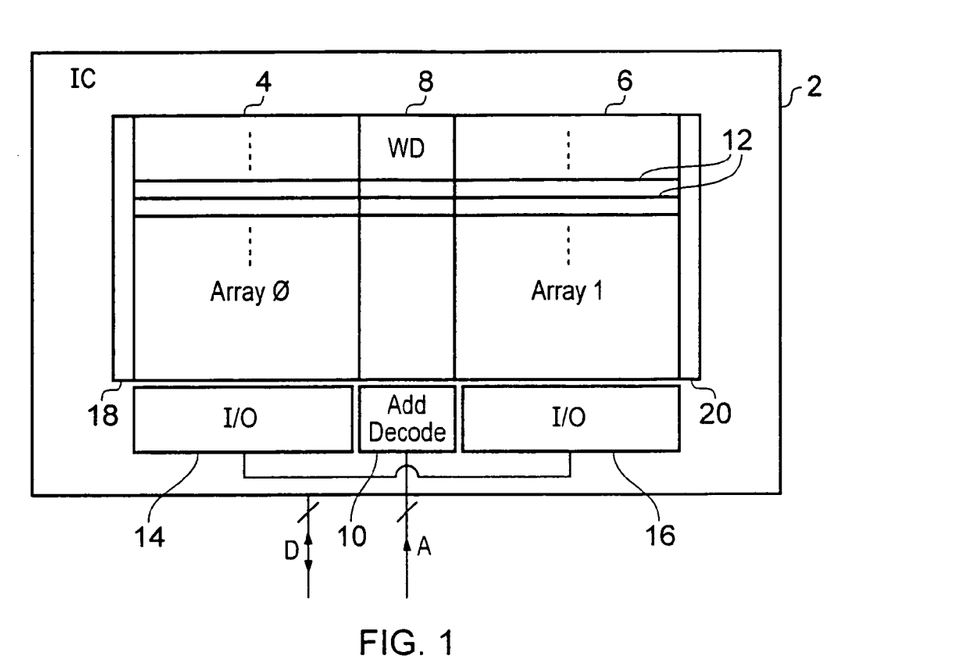
FIG. 1 schematically illustrates an integrated circuit memory.

FIG. 1 shows an integrated circuit memory 2 including a first array of bit cells 4 and a second array of bit cells 6. Word line driver circuitry 8 is disposed between the first array 4 and the second array 6. Address decoder circuitry 10 operating in conjunction with the word line driver circuitry 8 serves to decode an address input to the integrated circuit memory 2 and active one of the word lines 12 running through the first array 4 and the second array 6. A data write or data read operation is then performed to the appropriate array 4, 6 via input output circuitry 14, 16.

As process geometries and operating voltages become smaller and the effects of process, voltage and temperature variation across an integrated circuit 2 become larger, the finite resistance and capacitance of the word lines 12 becomes significant and there is a delay in a word line signal reaching its full asserted value and this delay increases the further along the word line 12 the signal must propagate from the word line driver circuitry 8. Thus, the word line signal may not properly reach its asserted value in sufficient time towards the edges of the arrays 4, 6 which are distal from the word line driver circuitry 6. The present technique seeks to address this problem by providing a plurality of first helper circuits 18 at the edge of the first array 4 which is opposite the edge at which the word line driver circuitry 8 is disposed. In a similar way a plurality of second helper circuits 20 are provided at the edge of the second array 6 opposite the word line driver circuitry 8. It is also possible to provide helper circuits within each array, either as an alternative or in addition.

When the appropriate word line is driven by the word line driver circuitry 8 the word line signal starts to move towards the fully asserted value. The relevant first and second helper circuits which are coupled to the word line 12 which is being driven are switched on by the rise in the word line signal (even though it has not fully reached the asserted value) and themselves then start to assist and further drive the word line signal towards the asserted value. In this way, the speed with which the word line signal rises toward the asserted value is increased. This helps to improve the speed of operation of the integrated circuit memory 2 as well as reducing the likelihood of incorrect read and write operations.

Figure 2:
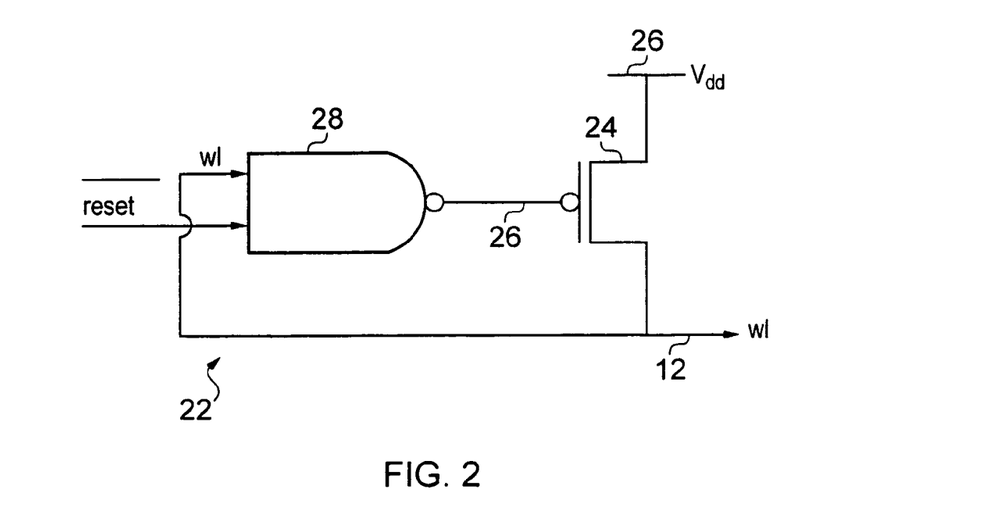
FIG. 2 schematically illustrates a first example word line helper circuitry.

FIG. 2 schematically illustrates one instance of a first example helper circuit 22. This helper circuit comprises a PMOS helper transistor 24 coupled between a supply rail 26 and the word line 12. The helper transistor 24 has a gate node 26 coupled to the output of combinatorial logic 28. The combinatorial logic 28 has a low output which switches on the helper transistor 24 if the word line signal is asserted and the reset signal is not asserted. Thus, when the word line signal on the word line 12 starts to rise towards the asserted value, then the combinatorial logic 28 switches on the helper transistor 24 which couples the word line 12 through the helper transistor 24 to the supply rail 26. The helper transistor 24 remains switched on until the reset signal is asserted. The reset signal may be a global reset signal used for other functions within the integrated circuit memory 2, such as timing the operation of the input/output circuitry 14, 16. The global reset signal may be a self-timed signal generated by, for example, passing a signal through a dummy array of memory cells. The falling edge of such a globally generated self-timed signal may be used as the reset.

Figure 3:
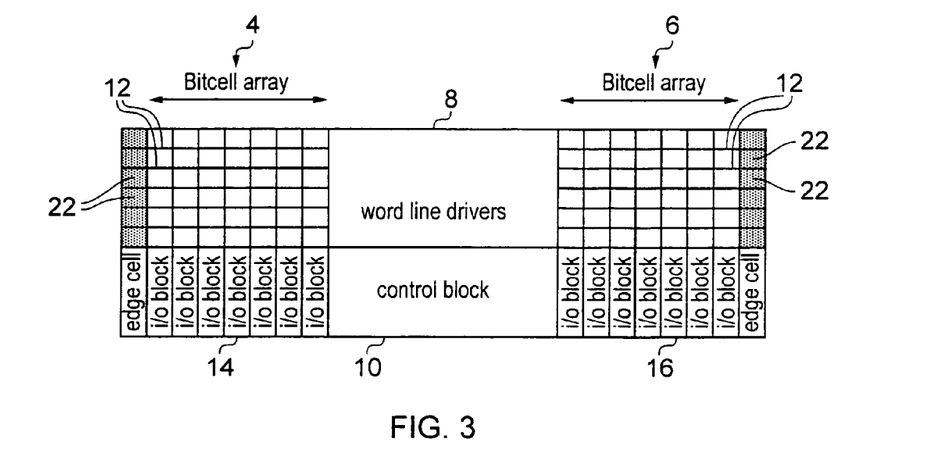
FIG. 3 schematically illustrates two arrays of memory cells with word line driver circuitry between the arrays and respective helper circuitry at the opposite edges of the arrays.

FIG. 3 illustrates a portion of an integrated circuit memory including a first array of bit cells 4 and a second array of bit cells 6. The word line driver circuitry 8 is disposed between this first array 4 and second array 6. A plurality of helper circuits 22 are disposed along the edges of these arrays 4, 6, opposite to the edge at which the word line driver circuitry 8 is located. Input/output circuitry 14, 16 serves to perform write operations to the bit cells within the arrays 4, 6 or read operations from the bit cells within the arrays 4, 6 as required. A control block 10 serves as an address decoder in conjunction with the word line driver circuitry 8 to respond to an input address signal and drive one of the word lines 12 to an asserted value such that an access is made to the bit cells within that row.

It will be appreciated that the word lines 12 may be separately provided for the individual arrays 4, 6. Alternatively, a common word line may run across both arrays and through the word line driver circuitry 8 so as to be driven by the appropriate buffer circuit within the word line driver circuitry 8 when an access is required to that row.

Figure 4:
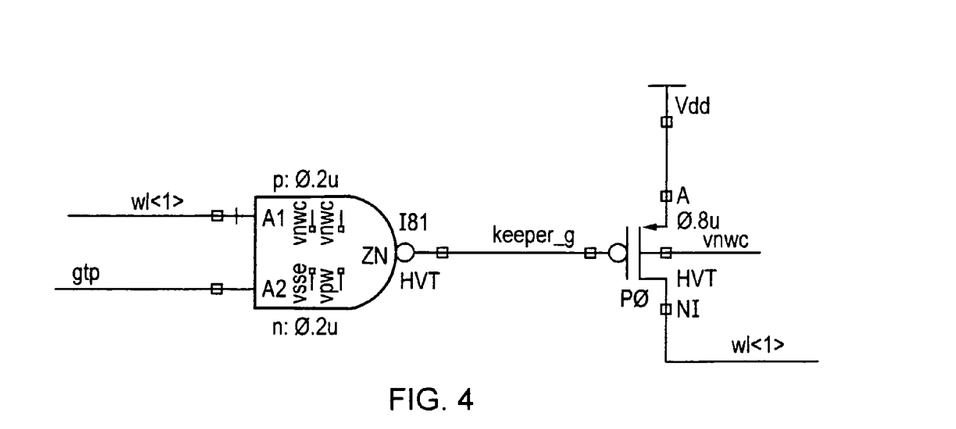
FIG. 4 is an alternative representation of the first example of the helper circuitry of FIG. 2.

FIG. 4 is an alternative view of the helper circuit 22 of FIG. 3. In this representation transistor dimensions are shown. It will be appreciated that these shown are by way of example only and alternative dimensions may be used.

Figure 5:
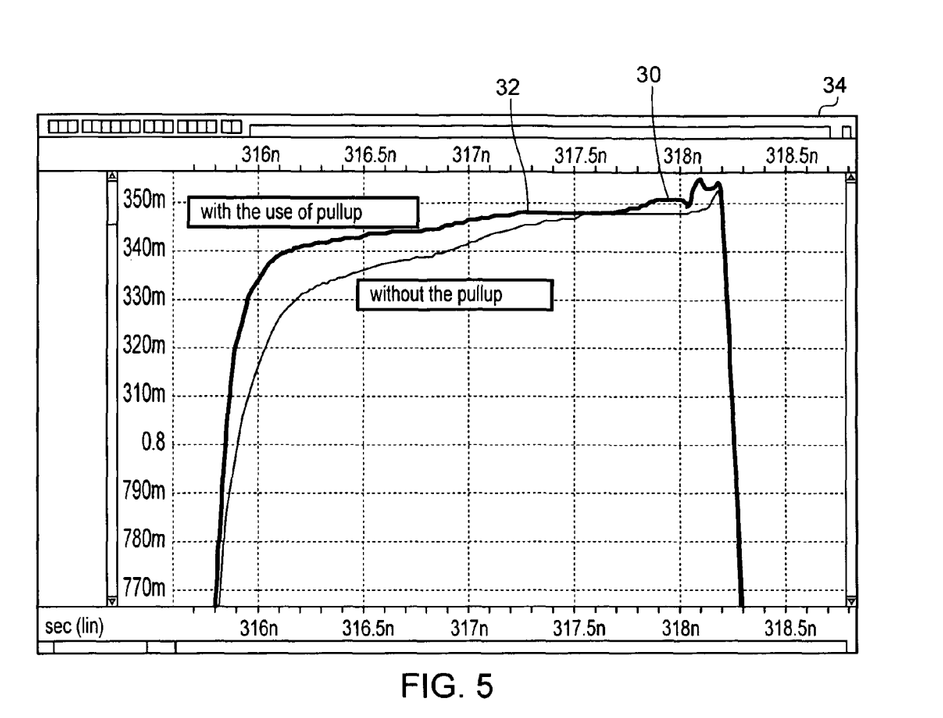
FIG. 5 is a signal diagram showing the effect of adding the word line helper circuitry in improving the write time of the word line signal towards the asserted value.

FIG. 5 is a signal diagram schematically illustrating the effect of the provision of the helper circuits 22 upon the rise time of the word line signal. The signal line 30 shows the rise time of the word line signal towards the asserted value 34 when helper circuits are not present. The signal line 32 shows the rise at the word line signal when the helper circuits 22 are provided. As will be seen, when the helper circuits 22 are provided the word line signal rises more rapidly toward the asserted value 34.

Figure 6:
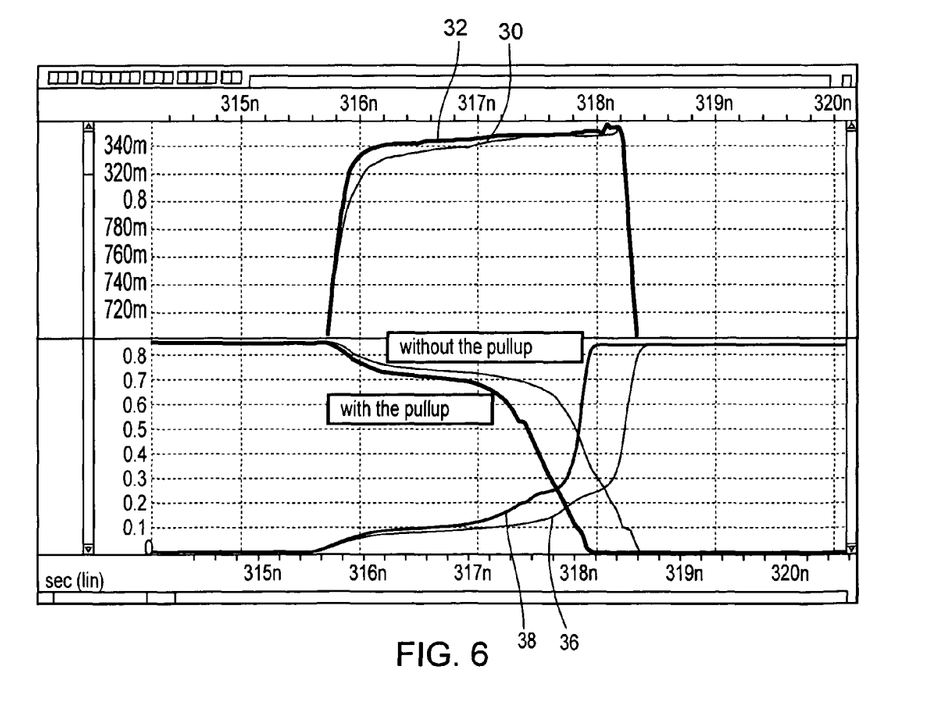
FIG. 6 is a signal diagram schematically illustrating the effect of the use of the word line helper circuitry in improving the speed with which a write operation may be performed within a bit cell.

FIG. 6 is a signal diagram showing the effect of the provision of the helper circuits 22 on the speed with which a bit cell within the array 4, 6 may be written. The top portion of FIG. 6 illustrates the rise of the word line signal in the case without the helper circuits 22 in signal line 30 and with the helper circuits 22 in the signal line 32. The bottom portion of FIG. 6 shows bit cell signals at the nodes of a bit cell connected to bit lines running through that bit cell switching from one value to another value as a result of a write operation. This write operation will not take place until the word line signal reaches a sufficiently asserted value such that access into the bit cell is permitted. When the word line signal is sufficiently asserted, the signal values being asserted on the bit lines for that bit cell cause the bit cell value to flip. As shown in FIG. 6, the curves 36 indicate that the flip of bit value occurs more slowly when the helper circuits 22 are not present compared to the curves 38 illustrating a situation when the helper circuits 22 are present. The helper circuits 22 thus enable faster and more reliable operation.

Figure 7:
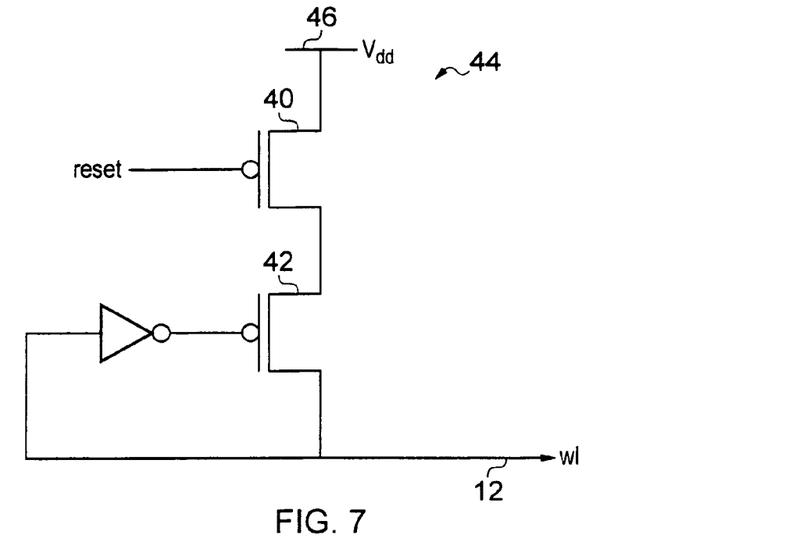
FIG. 7 schematically illustrates a second example of word line helper circuitry.

FIG. 7 schematically illustrates a second example helper circuit 44. This example helper circuit comprises a stack of 5 PMOS transistors being a helper transistor 42 and a header transistor 40. The helper transistor 42 has its gate node switched by the inverted word line signal such that as the word line 12 is driven towards its asserted value by the word line driver circuitry 8, the helper transistor 42 switches on. In order that the supply voltage at the supply rail 46 can be coupled through to the word line 12 via the helper transistor 42, the header transistor 40 must also be switched on. Thus, if the reset signal to the gate of the header transistor 40 is not asserted, then the header transistor 40 would be switched on and the switching on of the helper transistor 42 will serve to further drive the word line 12 towards the asserted value.

Figure 8:
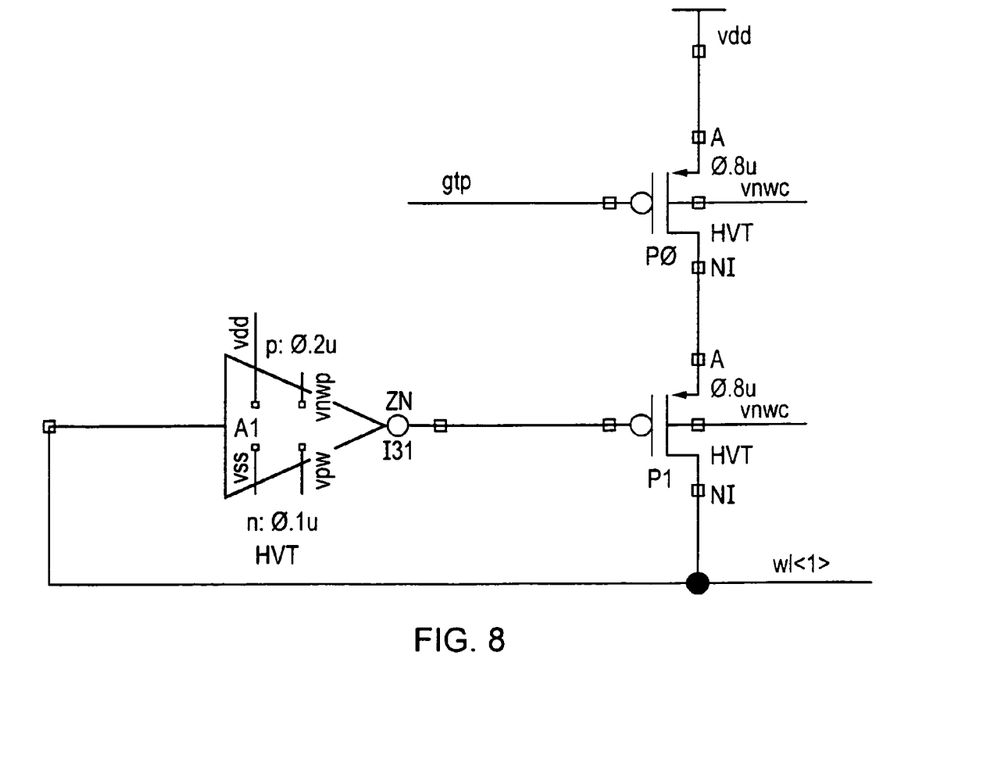
FIG. 8 is an alternative representation of the second example of the helper circuitry of FIG. 7.

FIG. 8 is an alternative view of the helper circuit 44 of FIG. 7. In this alternative view transistor example transistor dimensions and other details are shown.

Figure 9:
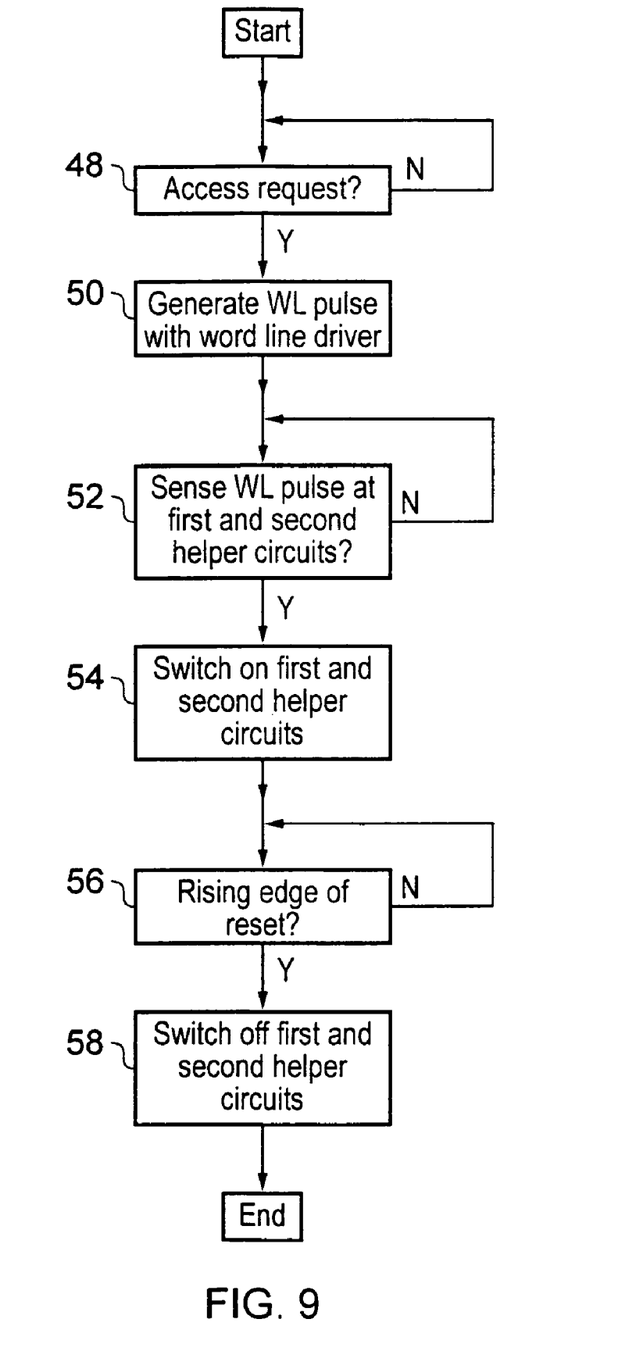
FIG. 9 is a flow diagram schematically illustrating the operation of the integrated circuit memory utilising the first and second helper circuitry.

FIG. 9 is a flow diagram schematically illustrating the operation of the word line driver circuitry and helper circuitry discussed above. At step 48 processing awaits until an access request is received. Step 50 generates a word line pulse using the word line driver circuitry on the appropriate word line being accessed. Step 52 corresponds to the first and second helper circuits 22, 44 waiting until they sense the word line pulse on the word line 12 to which they are coupled. The word line pulse corresponds to the word line signal starting to be driven toward the asserted value. When this word line pulse is detected at step 52, step 54 switches on the first and second helper circuits 42, 44. The first and second helper circuits 42, 44 remain switched on whilst step 56 waits until the rising edge of the reset signal is detected, which may be triggered by the global reset signal, e.g. the trailing edge, or a delayed rising edge, of the word line pulse. This falling edge of the global reset signal triggers to the reset signal which switches off the first and second helper circuits 22, 44 at step 58. It will be appreciated that different circuit variations can use other combinations of rising/falling edges of the reset signal and/or global reset signal to control the switching on and off of the helper circuits.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit memory comprising:
a first array of memory cells;
a second array of memory cells;
word line driver circuitry located between said first array and said second array;
a first plurality of word lines extending from a first side of said word line driver circuitry through said first array;
a second plurality of word lines extending from a second side of said word line driver circuitry through said second array;
a first plurality of word line helper circuits coupled to respective word lines of said first plurality of word lines; and
a second plurality of word line helper circuits coupled to respective word lines of said second plurality of word lines; wherein said word line driver circuitry is responsive to an access request to drive a first word line signal upon a first driven word line of said first plurality of word lines toward a first asserted value and to drive a second word line signal upon a second driven word line of said second plurality of word lines toward a second asserted value;
said first plurality of word line helper circuits include a first word line helper circuit coupled to said first driven word line and switched by said first word line signal being driven toward said first asserted value to further drive said first word line signal toward said first asserted value such that said first word line signal value more rapidly reaches said first asserted value; and
said second plurality of word line helper circuits include a second word line helper circuit coupled to said second driven word line and switched by said second word line signal being driven toward said second asserted value to further drive said second word line signal toward said second asserted value such that said second word line signal value more rapidly reaches said second asserted value.

2. An integrated circuit memory as claimed 1, wherein said first word line helper circuit is responsive to a reset signal to cease driving said first word line toward said first asserted value and said second word line helper circuit is responsive to said reset signal to cease driving said second word line toward said second asserted value.

3. An integrated circuit memory as claimed in claim 2, wherein said reset signal is a global reset signal coupled to said word line driver circuitry to trigger said word line driver circuitry to drive said first word line signal away from said first asserted value and to trigger said word line driver circuitry to drive said second word line signal away from said second asserted value.

4. An integrated circuit memory as claimed in claim 3, wherein said global reset signal is a self-timed signal generated a predetermined time after initiation of said access request.

5. An integrated circuit memory as claimed in claim 4, wherein said global reset signal is triggered from a trailing edge of a word line pulse signal controlling said word line driver circuitry.

6. An integrated circuit memory as claimed in claim 1, wherein said first word line helper circuit coupled to said first driven word line comprises a first helper transistor configured to selectively couple said first driven word line to a supply rail carrying a supply signal corresponding to said first asserted value.

7. An integrated circuit memory as claimed in claim 6, wherein said first helper transistor has a first helper gate node at least partially controlled by said first word line signal.

8. An integrated circuit memory as claimed in claim 7, wherein said first helper gate node is coupled to a combinatorial logic circuit combining said first word line signal with a reset signal.

9. An integrated circuit as claimed in claim 6, wherein said first helper transistor is coupled to said supply rail via a first header transistor, said first header transistor being responsive to a reset signal to block a signal path from said supply rail to said first driven word line.

10. An integrated circuit memory as claimed in claim 1, wherein said second word line helper circuit coupled to said second driven word line comprises a second helper transistor configured to selectively couple said second driven word line to a supply rail carrying a supply signal corresponding to said second asserted value.

11. An integrated circuit memory as claimed in claim 10, wherein said second helper transistor has a second helper gate node at least partially controlled by said second word line signal.

12. An integrated circuit memory as claimed in claim 11, wherein said second helper gate node is coupled to a combinatorial logic circuit combining said second word line signal with a reset signal.

13. An integrated circuit memory as claimed in claim 10, wherein said second helper transistor is coupled to said supply rail via a second header transistor, said second header transistor being responsive to a reset signal to block a signal path from said supply rail to said second driven word line.

14. An integrated circuit memory as claimed in claim 1, wherein said word line driver circuitry is located at a first edge of said first array and said first plurality of word line helper circuits are located at an second edge of said first array, said second edge of said first array being opposite to said first edge of said first array.

15. An integrated circuit memory as claimed in claim 1, wherein said word line driver circuitry is located at a first edge of said second array and said second plurality of word line helper circuits are located at an second edge of said second array, said second edge of said second array being opposite to said first edge of said second array.

16. An integrated circuit memory as claimed in claim 1, wherein said first word line signal and said second word line signal are a common word line signal.

17. An integrated circuit memory comprising:
 a first array of memory cell means;
 a second array of memory cell means;
 word line driver means located between said first array and said second array;
 a first plurality of word lines extending from a first side of said word line driver means through said first array;
 a second plurality of word lines extending from a second side of said word line driver means through said second array;
 a first plurality of word line helper means coupled to respective word lines of said first plurality of word lines; and
 a second plurality of word line helper means coupled to respective word lines of said second plurality of word lines; wherein
 said word line driver means is responsive to an access request to drive a first word line signal upon a first driven word line of said first plurality of word lines toward a first asserted value and to drive a second word line signal upon a second driven word line of said second plurality of word lines toward a second asserted value;
 said first plurality of word line helper means include a first word line helper means coupled to said first driven word line and switched by said first word line signal being driven toward said first asserted value to further drive said first word line signal toward said first asserted value such that said first word line signal value more rapidly reaches said first asserted value; and
 said second plurality of word line helper means include a second word line helper means coupled to said second driven word line and switched by said second word line signal being driven toward said second asserted value to further drive said second word line signal toward said second asserted value such that said second word line signal value more rapidly reaches said second asserted value.

18. A method of operating an integrated circuit memory having:
 a first array of memory cells;
 a second array of memory cells;
 word line driver circuitry located between said first array and said second array;
 a first plurality of word lines extending from a first side of said word line driver means through said first array;
 a second plurality of word lines extending from a second side of said word line driver means through said second array;
 a first plurality of word line helper circuits coupled to respective word lines of said first plurality of word lines; and
 a second plurality of word line helper circuits coupled to respective word lines of said second plurality of word lines; said method comprising the steps of:
 in response to an access request, driving a first word line signal upon a first driven word line of said first plurality of word lines toward a first asserted value and driving a second word line signal upon a second driven word line of said second plurality of word lines toward a second asserted value;
 using a first word line helper circuit of said first plurality of word line helper circuits and switched by said first word line signal being driven toward said first asserted value to further drive said first word line signal toward said first asserted value such that said first word line signal value more rapidly reaches said first asserted value; and
 using a second word line helper circuit of said second plurality of word line helper circuits and switched by said second word line signal being driven toward said second asserted value to further drive said second word line signal toward said second asserted value such that second first word line signal value more rapidly reaches said second asserted value.

* * * * *